United States Patent [19]
Von Bokern

[11] Patent Number: 4,998,076
[45] Date of Patent: Mar. 5, 1991

[54] APPARATUS AND METHODS FOR SIMULATING A LIGHTNING STRIKE IN AN AIRCRAFT AVIONICS ENVIRONMENT

[75] Inventor: Greg J. Von Bokern, Kent, Wash.

[73] Assignee: The Boeing Company, Seattle, Wash.

[21] Appl. No.: 398,812

[22] Filed: Aug. 25, 1989

[51] Int. Cl.$^5$ .................... H03B 29/00; H03K 3/84
[52] U.S. Cl. ............................ 331/78; 315/205; 328/53; 328/63
[58] Field of Search ............... 331/78, 55; 328/53, 328/62, 63; 307/305; 315/205, 209 SC, 226

[56] References Cited

U.S. PATENT DOCUMENTS

| | | | |
|---|---|---|---|
| 2,457,790 | 12/1948 | Wild et al. | 331/49 |
| 2,842,667 | 7/1958 | Dench et al. | 331/56 X |
| 2,974,198 | 3/1961 | McLeod | 331/78 X |
| 3,069,632 | 12/1962 | Sterzer | 331/56 X |
| 3,243,729 | 3/1966 | Olson et al. | 307/305 X |
| 3,309,541 | 3/1967 | Baker | 307/106 |
| 3,366,779 | 1/1968 | Catherall et al. | 331/78 X |
| 3,465,172 | 9/1969 | Ragusa | 307/265 |
| 3,564,447 | 2/1971 | Chase | 331/42 |
| 3,573,545 | 4/1971 | Warner | 315/209 SC |
| 3,573,633 | 4/1971 | Marrero | 328/30 |
| 3,617,925 | 11/1971 | Bensema | 331/78 |
| 3,764,992 | 10/1973 | Milne | 331/49 X |
| 3,780,213 | 12/1973 | Harna | 331/78 X |
| 3,920,894 | 11/1975 | Shirley et al. | 331/78 X |
| 3,986,136 | 10/1976 | Hurlburt | 331/78 |
| 4,176,643 | 12/1979 | Beeghly | 315/209 SC |
| 4,286,228 | 8/1981 | Wise et al. | 331/49 |
| 4,612,517 | 9/1986 | Wagner | 331/46 |

FOREIGN PATENT DOCUMENTS 312253  8/1971  U.S.S.R. .................. 331/78

OTHER PUBLICATIONS

Kuno, "High Frequency SCR Power Generator", RCA Technical Notes, No. 818, Feb. 18, 1969.

Primary Examiner—Siegfried H. Grimm
Attorney, Agent, or Firm—Robert H. Sproule; B. A. Donahue

[57] ABSTRACT

A tester simulates high energy pulses typically present at the inputs to an avionics device after an aircraft carrying the avionics device has been struck by lightning. The tester is used to assist in determining whether the avionics device is sufficiently protected against the effects of a lightning strike on the aircraft. The tester includes a trigger circuit for generating trigger signals at fixed or random intervals so that the pulses which make up each burst as well as the bursts themselves are generated at fixed or random intervals. A number of individual pulse generating circuits are provided to generate high energy pulses which are output to the avionics device under test. A sequencing circuit feeds the trigger signals to the pulse generating circuits so as to generate the high energy pulses and bursts at the selected fixed or random intervals.

9 Claims, 11 Drawing Sheets

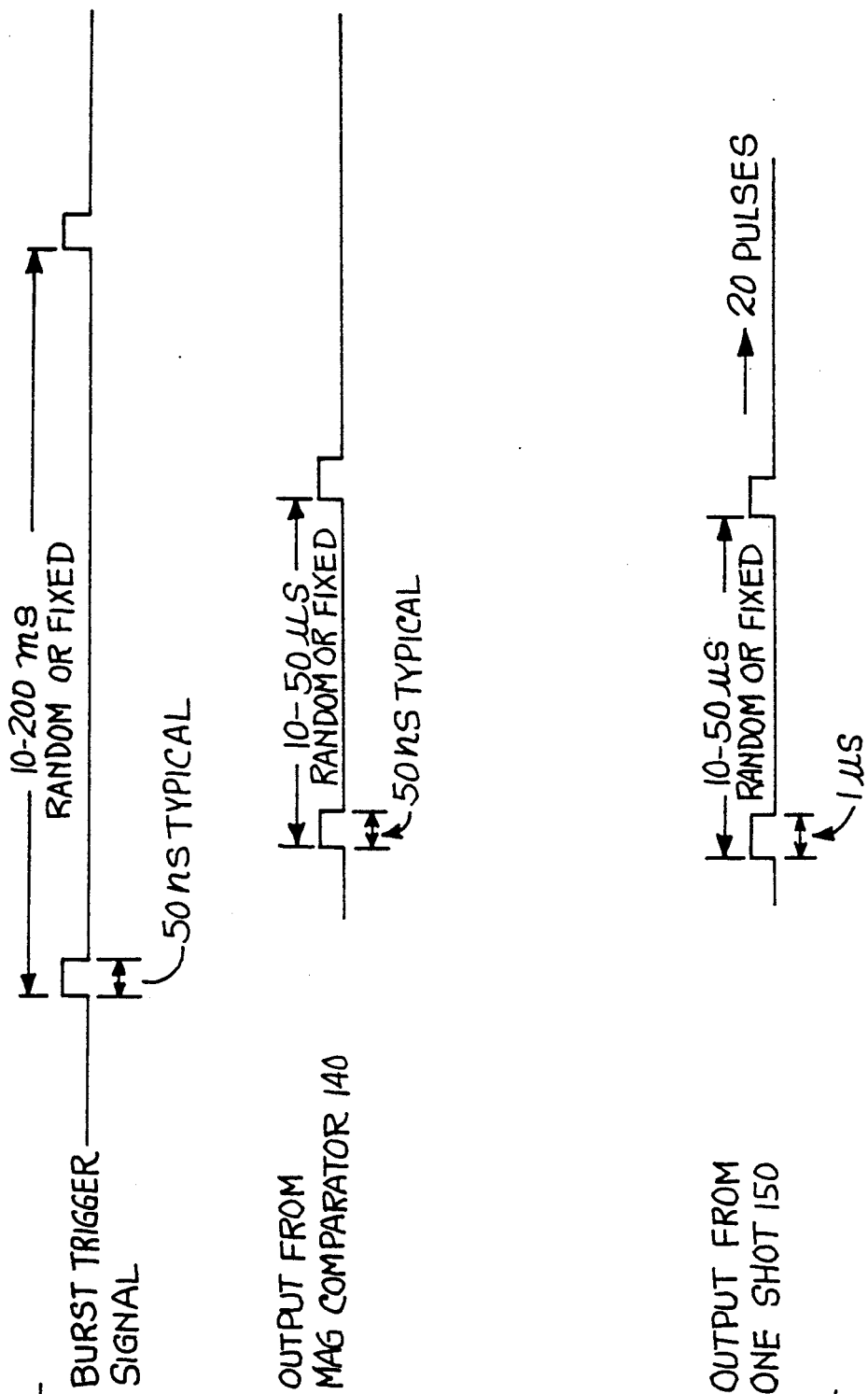

APPARATUS AND METHODS FOR SIMULATING A LIGHTNING STRIKE IN AN AIRCRAFT AVIONICS ENVIRONMENT

TECHNICAL FIELD

The present invention pertains to a system for simulating a multiple burst lightning strike so that avionics systems to be carried on board an aircraft can be tested to determine whether they are adequately protected from the effects of an actual lightning strike.

BACKGROUND OF THE INVENTION

It is important that aircraft avionics systems be designed to withstand the large changes in voltage, current and magnetic field when an aircraft is subjected to a lightning strike. Adequately protected avionic systems are even more important in the new generation of fly-by-wire aircraft where control of aircraft systems is accomplished entirely by electrical signals.

In the United States, the Federal Aviation Administration (FAA) has established minimum standards for protecting aircraft avionics systems from lightning. Previously, in order to test the avionics systems, a lightning strike on the aircraft was simulated by a test set which generated a single burst of either one Mhz or ten Mhz damped sinusoidal high energy pulses. More recent studies of aircraft lightning strikes have indicated that an aircraft lightning strike can generate multiple bursts of high energy. In response to a recommendation by the SAE Committee Draft Advisory Circular on "Protection of Aircraft Electrical/Electronic Systems Against the Indirect Effects of Lightning", the FAA has required that avionics testing be accomplished in a multiple burst environment.

It is recognized that only a fraction of the total energy of a lightning strike will appear at the avionics boxes inside the aircraft. This is because aircraft fuselage and related components provide a significant amount of shielding. By properly routing the system cables, the H field coupling between the cables and the aircraft frame can be significantly reduced. Further protection of the avionics systems can be provided through proper shielding of the cables and boxes.

Using established techniques, the "worst case" voltage and current to appear at the avionics boxes can be determined. This worst case signal provides a standard for simulation by a lightning strike simulator. It has been determined that the optimum simulation of a lightning strike is achieved by a multiple burst signal having a number of individual pulses per burst wherein the intervals between pulses as well as the intervals between bursts are random in nature.

Previous attempts to provide a multiple burst simulator have included a so-called "chatter system" which uses a coil and a commutator. The chatter system has proved to be unsatisfactory because, among other reasons, it fails to generate sufficient energy to accurately simulate a lightning strike. In addition, the pulses generated by the chatter system cannot be accurately duplicated thereby making it difficult to detect and analyze equipment disturbances caused by these pulses.

Other conventional systems include a random signal generator described in U.S. Pat. No. 2,974,198 by McLeod which generates independent signals of random occurrence and length for use in testing transmission systems. The generator uses a number of parallel pulse generating circuits which are responsive to filtered signals from a noise source.

In addition, Russian Patent No. 312253 discloses a random time interval generator which includes a random pulse generator which is connected downstream through a shift register and a number of coincidence circuits to respective Pulse generators.

Furthermore, RCA Technical Note #818, "High Frequency SCR Power Generator", discusses a high power generator which uses a number of SCR's which are switched sequentially to generate a continuous wave signal.

SUMMARY OF THE INVENTION

The present invention pertains to apparatus and methods for generating high energy signals. In a preferred embodiment, the high energy signals are used to simulate the signals typically present at the inputs to an avionics device during a lightning strike on the aircraft carrying the electronics device. More particularly, the apparatus includes means for generating trigger signals at selected intervals, as well as a plurality of pulse generating circuits for generating the high energy signals. Also included are means, responsive to the trigger signals, for triggering the pulse generating circuits at the selected intervals so as to generate the high energy signals at the selected intervals.

BRIEF DESCRIPTION OF THE DRAWINGS

The present invention will be described in greater detail in the following detailed description by reference to the following drawings, in which:

FIGS. 7A and 7B are timing diagrams which illustrate the timing relationships of a number of signals generated by components shown in FIGS. 5, 6A and 6B.

DETAILED DESCRIPTION

The present invention pertains to a system for generating a random, multiple burst signal. In a preferred embodiment, the system will be described for application in simulating a lightning strike on an aircraft for purposes of testing the ability of avionics equipment to be used on board the aircraft to withstand a lightning strike. The waveforms generated by the present invention conform to standards set by the Federal Aviation Administration. However, it should be appreciated that the present invention is not limited to its preferred embodiment.

Figure 1A:
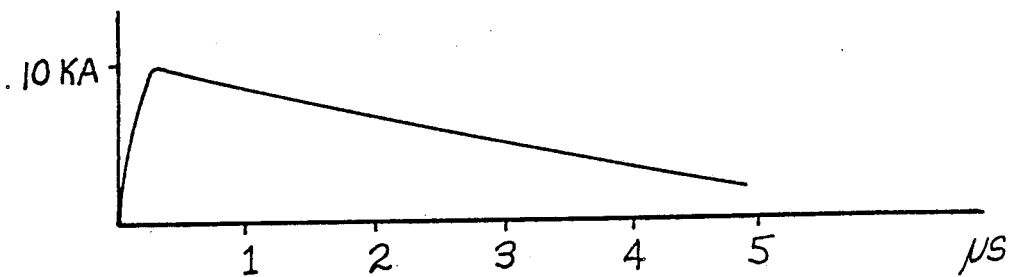
FIGS. 1A through 1C are simplified waveform diagrams which set forth standards adopted by the FAA to simulate the external environment of an aircraft when subjected to a lightning strike.
Figure 1B:
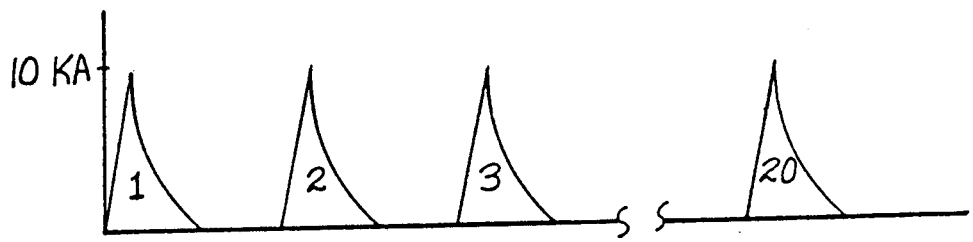
Figure 1C:
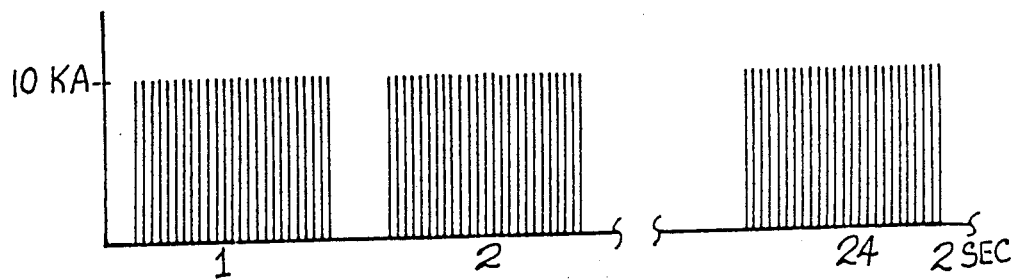

Proceeding with a description of the preferred embodiment, it is known that under current FAA guidelines the external lightning multiple burst waveform must include pulses which occur repetitively in twenty four randomly spaced bursts of twenty randomly spaced pulses each (FIG. 1). Each burst should have a peak current of ten kiloamperes and a duration of one millisecond. The twenty four sets of bursts should have a total duration of two seconds. This waveform represents the external multiple burst lightning environment; that is, the waveform as it would be if it were unaffected by the aircraft structure.

Figure 2A:
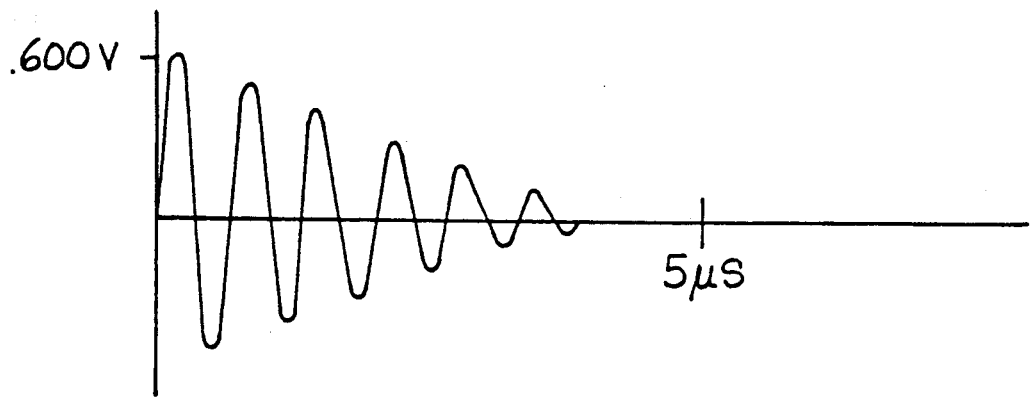
FIGS. 2A through 2C are simplified diagrams of the waveforms generated by the present invention.
Figure 2B:
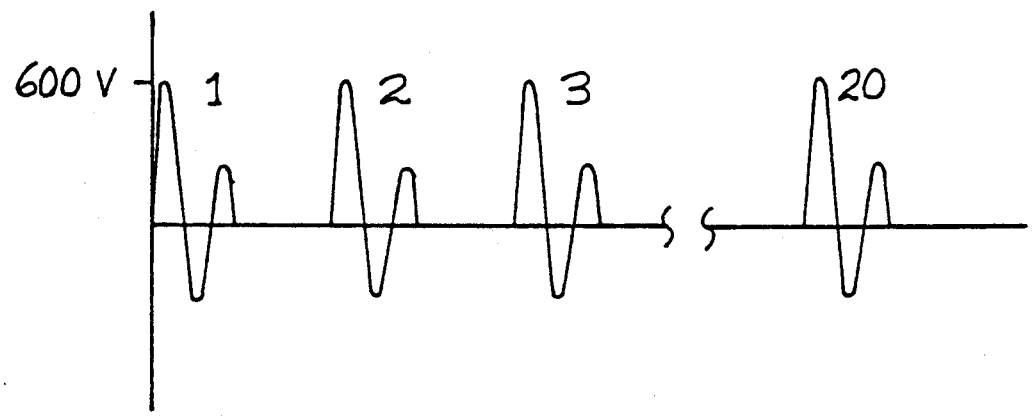
Figure 2C:
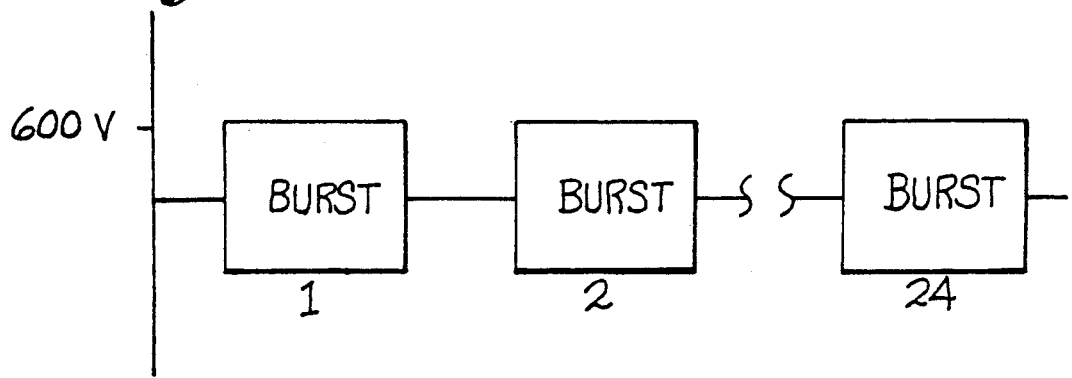

The actual waveform appearing at the avionics equipment interface is a function of the aircraft's external environment as well as aircraft structural and other shielding protection. It has been determined that a "worst case" component H waveform appearing at the input to the avionics device for a typical commercial aircraft would have a frequency of about one Mhz, a peak output of six hundred volts open circuit, and would be substantially damped after three or four oscillations (as shown in FIG. 2). The simulator of the present invention duplicates this waveform at the inputs to the avionics units under test.

Figure 3:
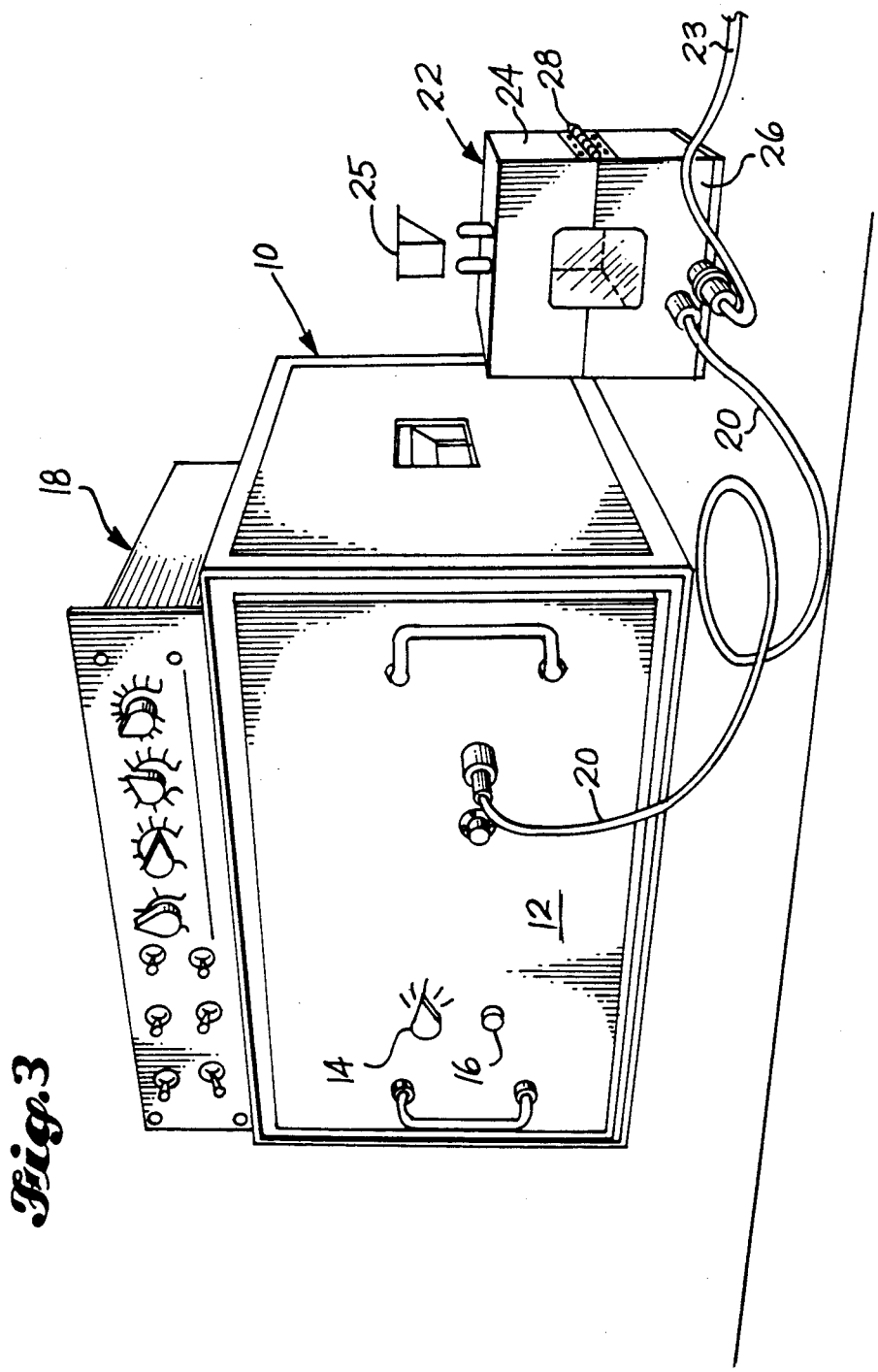
FIG. 3 is a diagram of the lightning strike simulator of the present invention.

Referring now to FIG. 3 there is shown a first embodiment in which the multiple burst simulator of the present invention includes a housing indicated at 10 having a front panel 12 where there is located a selector switch 14. The switch 14 allows an operator to select between five different burst patterns including (1) a single burst of twenty pulses, (2) twenty four bursts of twenty pulses per burst wherein the intervals between each burst as well as the intervals between each pulse making up a burst are fixed, (3) twenty four bursts of twenty pulses per burst wherein the intervals between the bursts and the intervals between the pulses are random, (4) a continuous series of bursts wherein the intervals between the bursts and the intervals between the pulses are fixed, and (5) a continuous series of bursts wherein the intervals between bursts and the intervals between the pulses are random. In order to trigger the burst patterns selected at the aforementioned switch positions 1, 2, and 3, a trigger push-button switch 16 also is located at the front panel.

Power to the lightning simulator is provided by a conventional power supply indicated at 18 which can supply up to sixteen hundred volts. An output from the simulator box is provided through a cable 20 which is connected to a coupling transformer indicated at 22 and which has a cable 23 (only partially shown) returning to the simulator. The transformer 22 has a clamshell configuration as shown in FIG. 3. The clamshell, which includes a handle 25, is formed into two parts including an upper part 24 and a lower part 26 which are joined together by a hinge 28 at one side and a catch (not shown) at the opposite side. In this manner, the coupling transformer is placed around the wire or wires leading into the avionics device under test. It has been found that a majority of the disturbances caused by lightning strikes are due to magnetic coupling with the wires leading to the avionics devices. The use of a clamshell device allows for reproduction of this magnetic coupling, as well as allowing for convenient attachment of the simulator to the avionics device under test.

Figure 4:
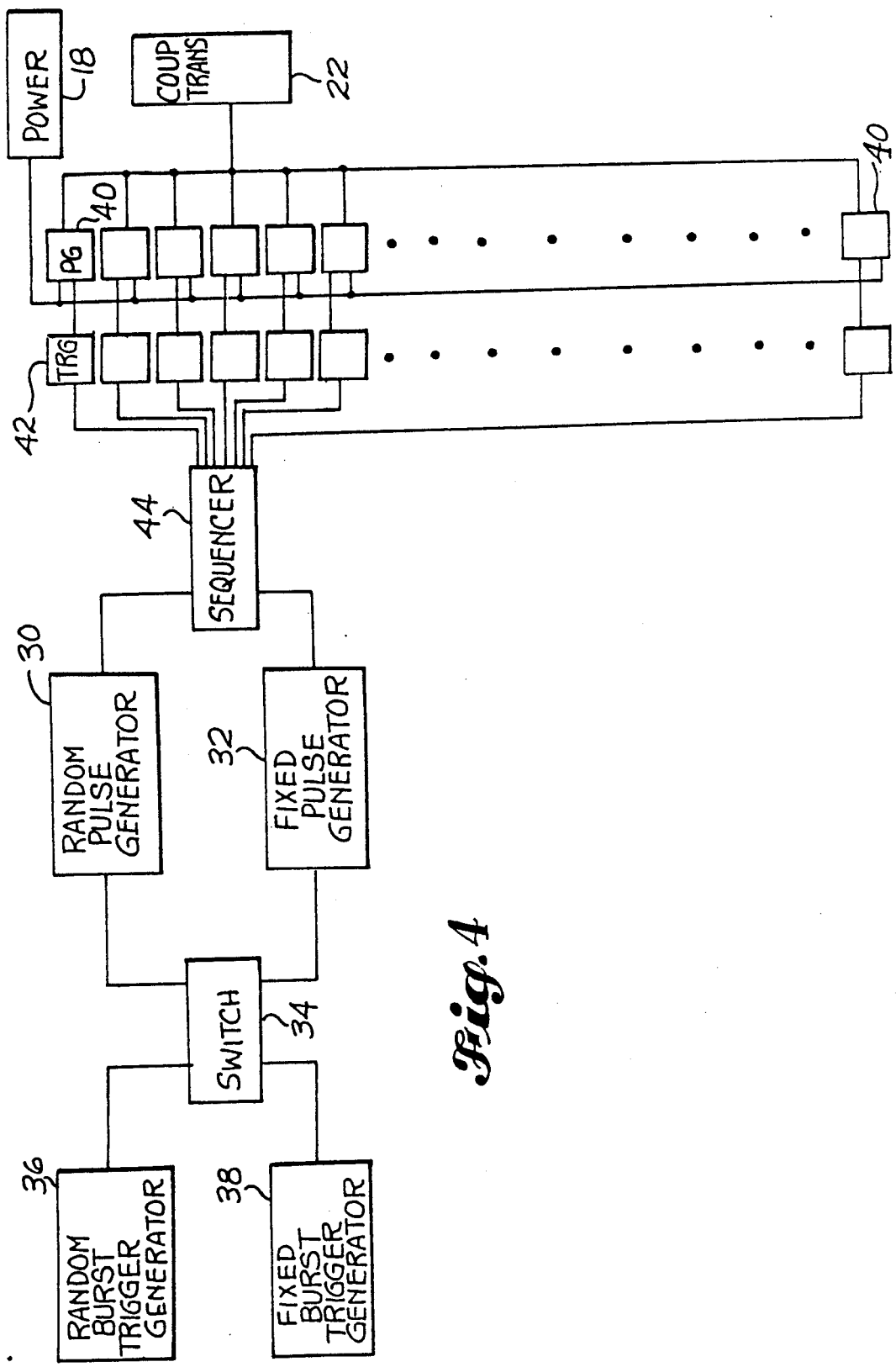
FIG. 4 is a simplified block circuit diagram of an exemplary embodiment of the present invention.

Before proceeding with a detailed discussion of the circuitry, an overview of the lightning simulator will be provided with reference to FIG. 4. Pulses of one microsecond duration which have random pulse intervals are generated at the random pulse generator block 30. Furthermore, pulses of one microsecond duration which have fixed pulse intervals of eighty three milliseconds are generated at fixed pulse generator block 32. Depending upon the position of selector switch 14 (FIG. 3), a switch block 34 in FIG. 4 selects either random interval burst trigger signals from a trigger generator 36 or fixed interval burst trigger signals from a trigger generator 38 and feeds these trigger signals to either the random pulse generator 30 or fixed pulse generator 32. The random burst trigger generator 36 generates a series of twenty four trigger signals, with each trigger signal having a width of 1.3 microseconds and a random interval between ten milliseconds and two hundred milliseconds.

The fixed burst trigger generator 38 generates a series of twenty four trigger signals with each trigger signal having a width of seventy five nanoseconds and an interval of eighty three milliseconds. In practice, if switch 14 (FIG. 3) is selected to generate twenty four bursts of random pulses (switch position #2), then switch block 34 (FIG. 4) passes a single twenty four burst trigger group from trigger generator 36 to random pulse generator 30. This causes pulse generator 30 to be triggered twenty four times, with each trigger signal causing the generation of twenty pulses which have random pulse intervals.

Still referring to FIG. 4, in order to generate sufficient energy to simulate a multiburst lightning strike, the output from the power supply 18 (between seven hundred and sixteen hundred volts) is fed to each of twenty pulse generators 40 (labelled P.G. in FIG. 4). The outputs of the generators 40 are tied together and fed into the coupling transformer 22. In order to generate a signal to the coupling transformer 22 which has sufficient energy to simulate a lightning strike, each one of the pulse generators is triggered sequentially by a respective upstream trigger control 42 (labelled TRG in FIG. 4). This allows each output generator 40 to charge up to its peak output before being triggered sequentially by the trigger control. The trigger sequence of each trigger control 42 is governed by an upstream sequencer 44, the input of which is tied to the outputs of the random pulse generator 30 and fixed pulse generator 32. For example, when a random burst waveform is selected, the output from random pulse generator 30 is sequenced so that each pulse is fed to a different trigger control 42 which in turn sequentially triggers its respective output generator 40. In this manner, the random pulses are sequentially fed to the coupling transformer 22 which inductively generates the desired input to the device under test.

Figure 5A:
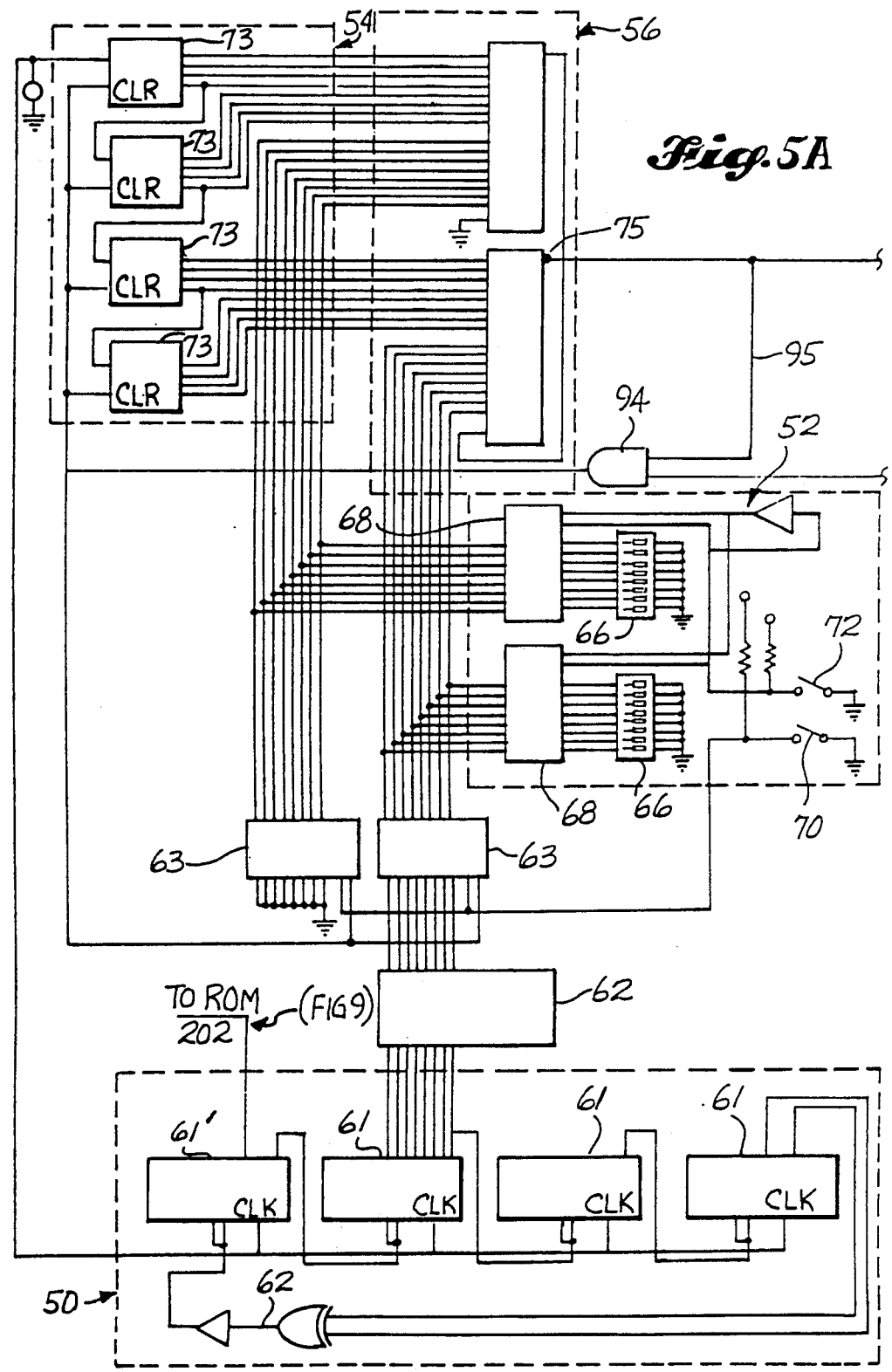
FIGS. 5A and 5B are more detailed circuit diagrams of a portion of the exemplary embodiment of the present invention.
Figure 5B:
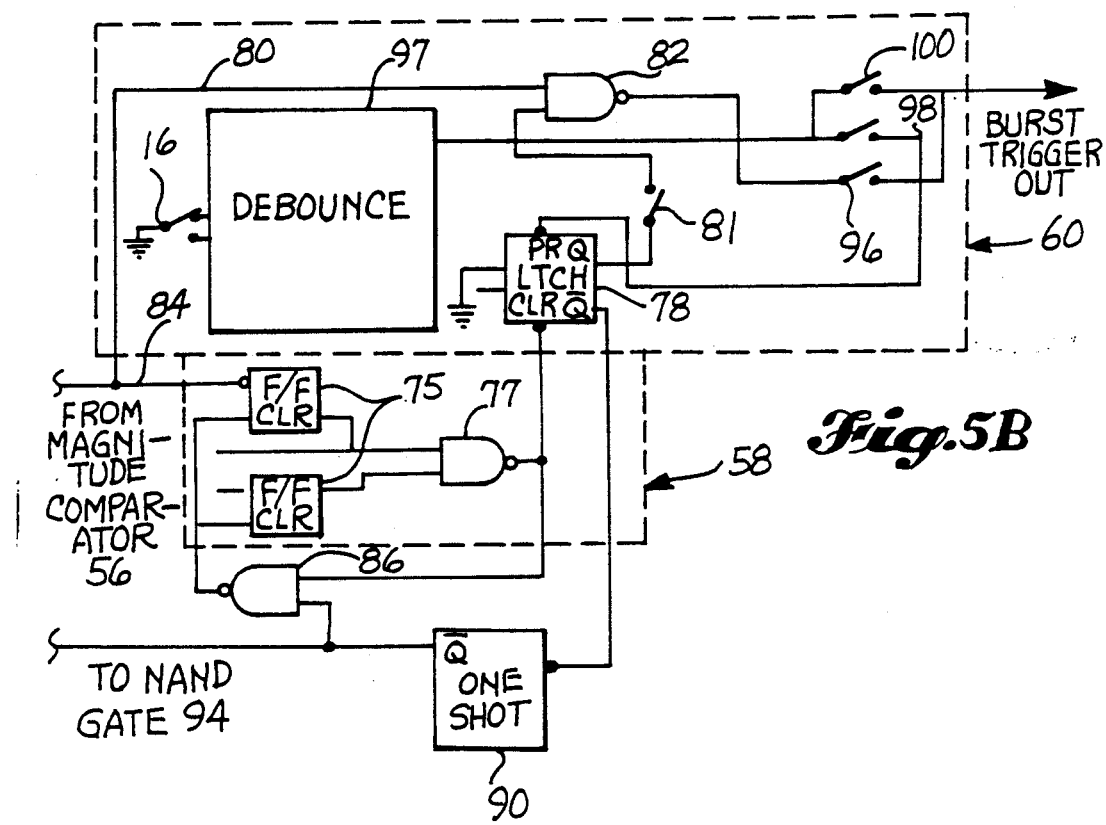

Having provided a broad overview of the present invention, attention now will be directed to a more detailed description. Referring to FIGS. 5A and 5B there is shown a portion of the simulator circuit including a conventional random number generator (enclosed by dashed lines) indicated at 50, a fixed number generator indicated at 52, a counting circuit indicated at 54, a magnitude comparator circuit indicated at 56, a pulse counting circuit indicated at 58 (FIG. 5B), and a switching circuit indicated at 60. The broad purpose of the circuits shown in FIGS. 5A and 5B is to generate the random burst trigger signals and the fixed burst trigger signals described previously. The random number generator 50 (FIG. 5A) includes four serial shift registers 61 and a feedback loop 62 which together generate a random eight bit digital word for a number of times equal to $2^{64}$ multiplied by the shift register clock frequency, after which this random cycle is repeated. The random number generator is described in further detail at pages 277 through 282 of the *TTL Cookbook* by Don Lancaster, published by Howard, W. Sams & Company, 1974.

The outputs from the shift registers 61 are fed to the address inputs of a ROM 62 which, in response thereto, generates digital trigger signals having random intervals between ten milliseconds and two hundred milliseconds. These random trigger signals are generated by programming the ROM 62 so that a first group of different addresses access a first common digital word output, a second group of different addresses access a second common digital word output, and so forth. For example, a digital word output from ROM 62 is selected so that the interval between pulses of that word is ten milliseconds. Another digital word is programmed into ROM 62 so that the interval between pulses of that word is twelve milliseconds. Another digitial word is programmed so that the interval between pulses is fourteen milliseconds, and so forth, up to a maximum interval between pulses of two hundred milliseconds. In this manner random burst trigger signals are generated which are latched by downstream latches 63. Because the numbers fed into the ROM address inputs are completely random, the output from the ROM 62 is also random.

In order to generate burst trigger signals having fixed intervals, there is provided in the fixed interval generator 52 (FIG. 5A) a pair of DIP switches 66 wherein the intervals between burst trigger signals are manually selected. The DIP switches 66 feed into a pair of latches 68 having outputs which are tied together with the outputs of latches 63. In a preferred embodiment, switch 14 (FIG. 3) is a ganged rotary switch having five positions, although in FIGS. 5A and 5B switch 14 is illustrated as a number of individual switch poles (70, 72, 96, 98, 100) for ease of understanding. When switch 14 is in any of the "random" interval positions (switch positions #3 and #5), a switch pole 70 (FIG. 5A) leading to generator 52 is closed which thereby enables the latches 63. At the same time switch pole 72 leading to fixed interval generator 52 is open, thereby disabling (tri-stating) latches 68. When switch 14 is in any of the "fixed" interval positions (positions #2 and #4), pole 70 is open and pole 72 is closed.

In order to generate fixed or random burst trigger signals, the counter 54, which is made up of four shift registers 73 (FIG. 5A), is clocked by a quartz crystal 74 (360 kHz) and counts sequentially up from zero. The output pins from counter 54 are tied to the output pins of latches 63, 68, which in turn are tied to the input pins of the magnitude comparator 56. When the count from counter 54 equals the output at latch 63 or 68 (whichever is enabled), the magnitude comparator 56 generates a pulse at output 75 which is fed downstream along a path 80 (FIG. 5B) through an NAND gate 82 and through a switch 96. When the switch 14 is in a "continuous" mode (switch positions #4 or #5), the NAND gate 82 is always "enabled" and the switch pole 96 is closed so as to provide continuous burst trigger signals which have fixed or random intervals depending upon the position of switch 14.

The output signal from magnitude comparator 56 is also fed along a path 84 (FIG. 5B) to the pulse counter 58 which counts up sequentially from zero to twenty four using a pair of serially connected flip flops 75; the outputs of which are connected to a downstream NAND gate 77. Upon reaching twenty four, the counter output switches state thereby clearing a latch 78. The resulting low output from latch 78 is fed to a switch 81. When the switch 14 is in one of the continuous modes, the switch pole 81 is open and the low signal from counter 58 does not reach the NAND gate 82 (therefore NAND gate 82 remains "enabled"). However, when the switch 14 is in a twenty four burst mode (switch positions #2 or #3), the switch pole 81 is closed. When latch 78 is cleared, the NAND gate 82 is effectively "disabled" so that only twenty four burst trigger signals are passed downstream through the closed switch pole 96.

In order to reset the counters 58 and 54 (FIG. 5A), the output of the NAND gate 77 (FIG. 5B) is tied to one input of a NAND gate 86 which has its output tied to the clear inputs of the flip flops 75. When latch 78 is cleared (after a count of twenty four has been reached), it fires a downstream one shot multivibrator 90 whose output is tied to the other input of the NAND gate 86. The resulting active low output from one shot multivibrator 90 occurring simultaneously with the active low from NAND gate 77 generates an active high at the NAND gate 86 to clear flip flops 75. In addition the active low output from one shot 90 is fed through a downstream NAND gate 94 (FIG. 5A). The resulting active high output from NAND gate 94 clears the counter 54 to allow another count up from zero to begin. The one shot 90 generates a sufficiently wide pulse through NAND gate 94 (FIG. 5A) for clearing the counters 54 and 58 and avoiding any race conditions.

Resetting of counter 54 is also accomplished in response to an active low output from magnitude comparator 56 which is fed into the other input of the NAND gate 94 via a path 95 (FIG. 5A). In this manner, the counter 54 is reset to zero after every output from magnitude comparator 56 (i.e. after every burst trigger signal).

In order to generate a single burst trigger signal (switch Position #1 in FIG. 3) or twenty four burst trigger signals (fixed or random), there is provided the push button trigger 16 (FIG. 5B) which is tied through a conventional debounce circuit 97 to a switch pole 98 which is in parallel with a switch pole 100. When switch 14 (FIG. 3) is in a one burst position (one trigger signal), switch pole 98 is open and switch pole 100 is closed. In this manner, only one burst trigger signal is generated when manual trigger 16 is pressed.

However when switch 14 is in a twenty four burst mode, switch pole 100 is open, and switch poles 96 and 98 are closed. In this manner, the output from manual trigger 16 is fed through switch pole 98 to the Preset input of latch 78. By presetting the latch 78, the latch output goes high which enables the NAND gate 82. After twenty four burst trigger signals have been generated, the latch 78 is cleared in the manner described previously, and the NAND gate 82 is disabled.

Having described the generation of the burst trigger pulses, the remainder of the present embodiment will be described. There is shown generally in FIG. 6A and 6B a pulse counting circuit indicated at 100 (which receives the burst trigger signals generated in FIG. 5B), a pulse width determining circuit indicated at 102, a sequencing circuit indicated at 106, a pulse interval determining circuit indicated at 107, and a pulse generating circuit indicated at 108. More specifically, the conventional counting circuit 100 includes a NAND gate 110 which receives the burst trigger signal to generate an active low output. This active low output clears a pair of serially connected flip flops 112 which are configured as a counter. The outputs from the flip flops 112 are fed through a latch 118 and to the inputs of three parallel demultiplexers 122a through 122c which form the sequencing circuit 106. In order to generate bursts of twenty pulses each, after the flip flops 112 have been clocked twenty times, a NAND gate 124, which is connected to the outputs of flip flops 112, generates an active low output which fires a downstream one shot multivibrator 126. The active low output from one shot 126 is fed to the other input of the NAND gate 110 which clears the flip flops 112 back to zero in order to begin another count.

Figure 6A:
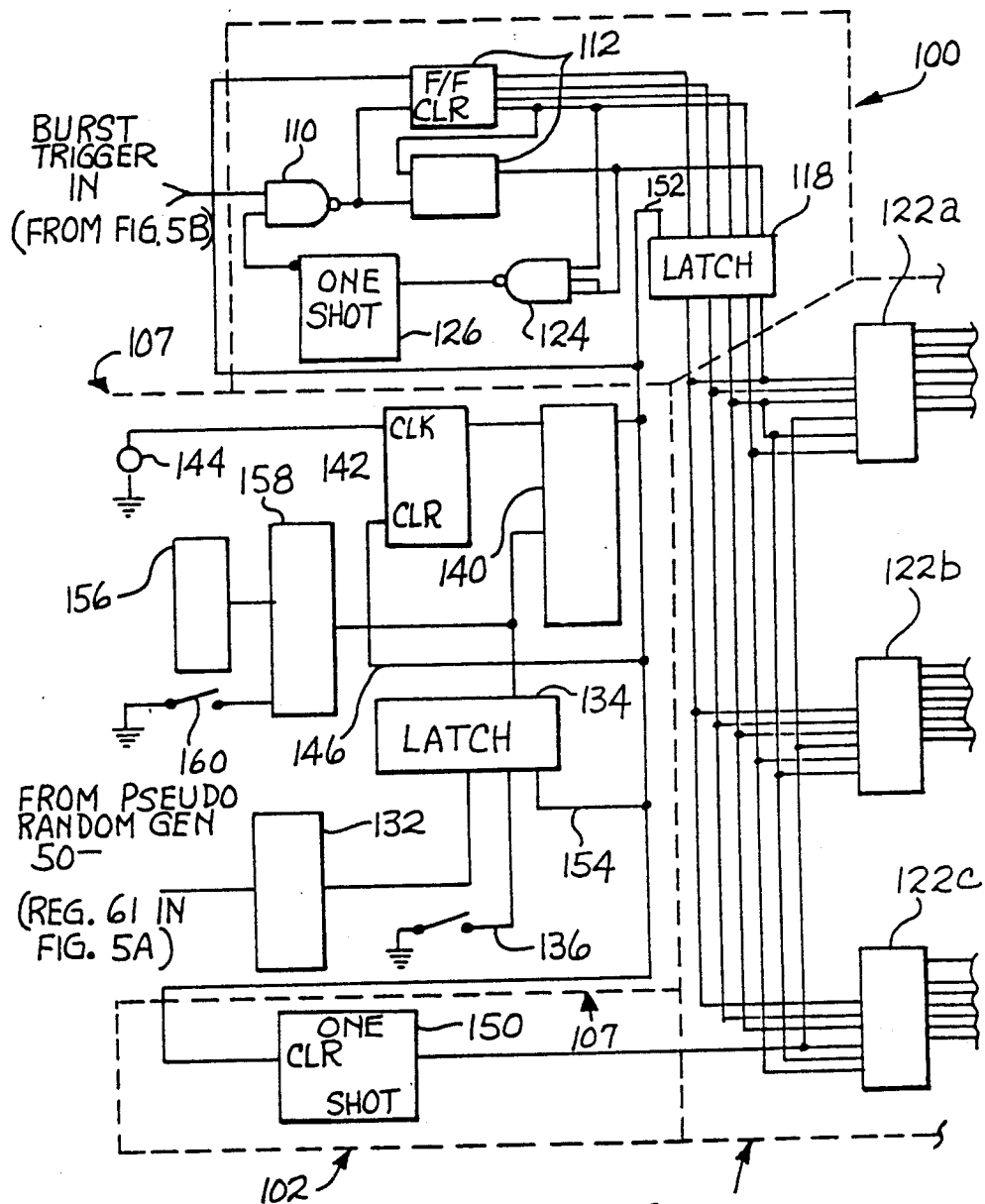
FIG. 6A and 6B are more detailed circuit diagrams of the remaining portion of the exemplary embodiment of the present invention.

In order to generate pulses which have either random or fixed intervals as selected by switch 14 (FIG. 3), there is shown the pulse interval determining circuit 107 in FIG. 6A. Random interval pulses are generated by feeding the output from the pseudorandom generator 50 at shift register 61' (in FIG. 5A) to a ROM 132 (FIG. 6A) which is programmed much the same as the ROM 62 in FIG. 5A so as to generate digital pulses having random pulse intervals between ten microseconds and fifty microseconds. Thus, the ROM 132 is programmed so that a first group of different addresses generate a first common digital output, a second group of different addresses generate a second common digital word output and so forth. The output from ROM 132 is latched by a downstream latch 134 when latch 134 is enabled by the closing of switch pole 136 (in response to placing switch 14 in the #3 or #5 positions). The output from latch 134 is fed to the input of a magnitude comparator 140 whose other input is tied to the output of a counter 142. The counter 142 is clocked by a two mHz oscillator 144. In this manner when the count from counter 142 reaches the random number latched at latch 134, the output from magnitude comparator 140 changes state which results in (1) the counter 142 being cleared via a reset line 146, (2) the flip flops 112 being clocked once, (3) the firing of a one shot multivibrator 150 so as to generate the selected pulse width in a manner to be described hereinafter, and (4) the enabling of latch 118 via line 152, and the enabling of latch 134 via line 154.

In order to provide for fixed intervals between pulses (switch 14 positions #2 and #4), a DIP switch 156 (FIG. 6A) feeds into a downstream latch 158, the output of which feeds into the magnitude comparator 140. When a fixed interval pulse mode is selected, a switch pole 160 is closed which enables the latch 158 thereby latching the value selected at the DIP switch 156. At the same time, the switch pole 136 is opened, thereby disabling the latch 134. In this manner, only the output from the DIP switch 156 appears at the input to the magnitude comparator 140.

Figure 7B:
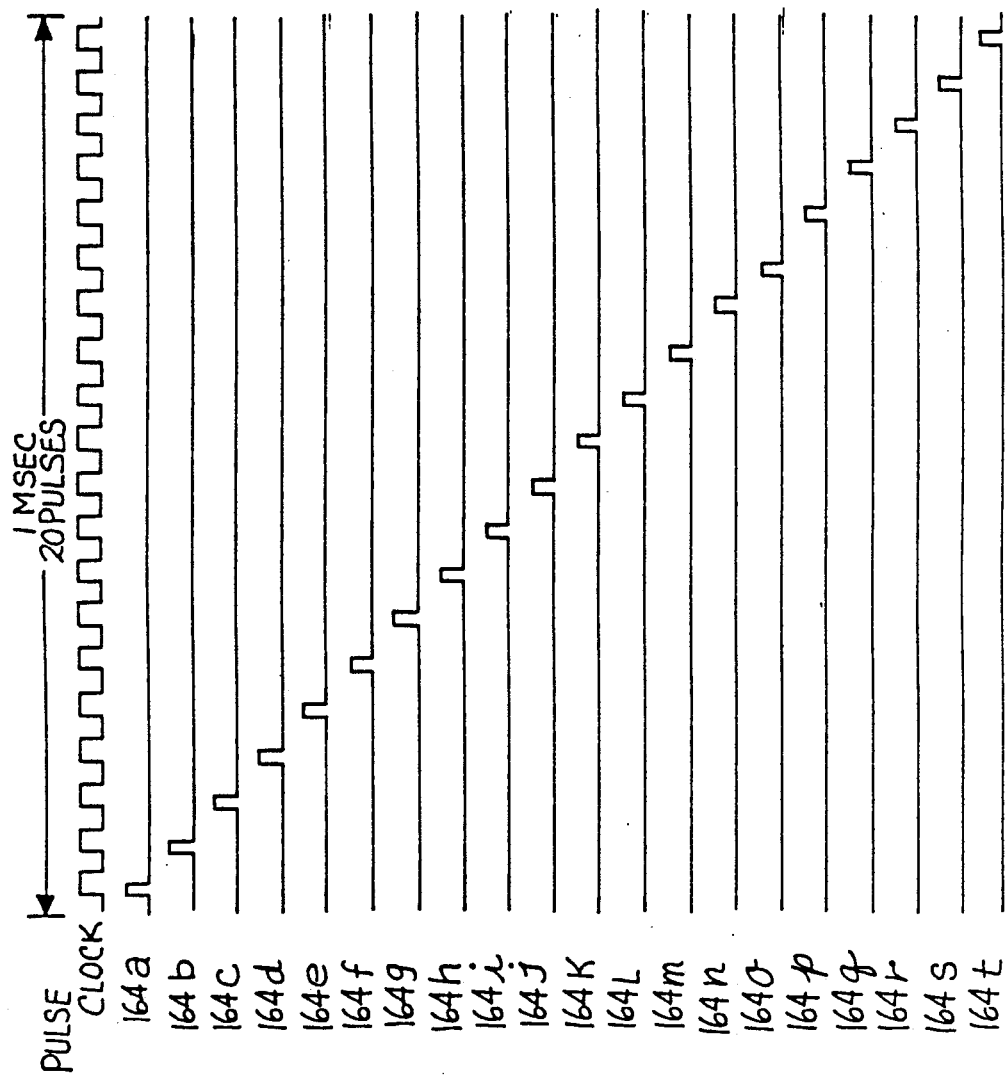

In order to control the width of the pulses making up each burst, the pulse width generator circuit 102 includes the one shot multivibrator 150 which is fired for a period of one microsecond when the output from magnitude comparator 140 goes active high. The output from multivibrator 150 is fed to the G1 pins of each demultiplexer thereby enabling them for a period of one microsecond. In this manner the demultiplexers generate a one microsecond pulse to each pulse generating subcircuit described below (FIGS. 7A & 7B).

Figure 6B:
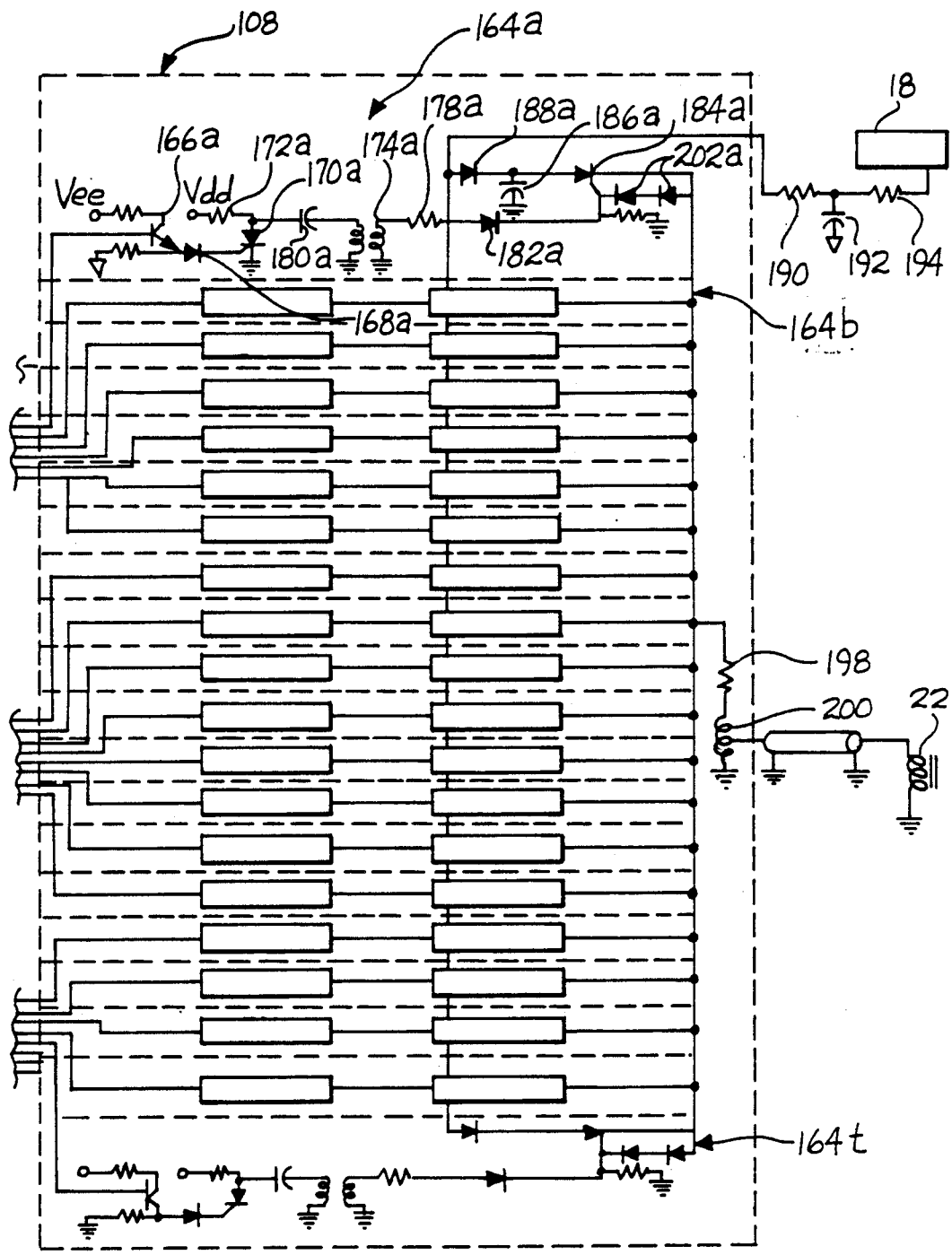

Each of the twenty pulses making up one burst is generated by a separate pulse generating subcircuit; these being identified by the numbers 164a through 164t in FIG. 6B. Only subcircuit 164a will be described here since it is identical to the other nineteen pulse generating subcircuits. As the demultiplexers 122 are addressed by the output of latch 118, the eight outputs of demultiplexer 122a are sequenced in order. Following the sequencing of these outputs, the outputs of demultiplexer 122b are sequenced in order, followed by the sequencing of demultiplexer 122c. This produces twenty sequenced active high outputs to the pulse generating circuit 108. For example, the active high signal from output $y_0$ of demultiplexer 122a is fed to the pulse generating subcircuit 164a where it turns on a transistor 166a in a common collector configuration. The emitter of the transistor 166a is tied through a DC blocking diode 168a to the gate of a silicon controlled rectifier (SCR) 170a. The SCR 170a has its cathode tied directly to ground and its anode tied through a current limiting resistor 172a to a positive voltage supply ($V_{dd}$) of sixty volts. The anode of SCR 170a is also tied to a transformer 174a which has its secondary winding tied through a current limiting resistor 178a. In this manner, when transistor 166a turns on, the gate current is caused to exceed the SCR threshold, thereby turning on SCR 170a. The turned-on SCR 170a generates a sixty volt spike by discharging capacitor 180a through transformer 174a. The diode 168a protects upstream components from the voltage spike, while the transformer 174a protects upstream components from large downstream voltages which are to be described shortly.

The large pulse through transformer 174a is passed through the resistor 178a and downstream through a blocking diode 182a to the gate of another SCR 184a. The SCR 184a has its anode tied to the anode of a capacitor 186a which in turn has it cathode tied to ground. The anode of capacitor 186a is tied upstream through a blocking diode 188a which in turn is tied upstream through a current limiting resistor 190 and to the anode of a capacitor 192 which in turn has its cathode tied to ground. The anode of capacitor 192 is tied through a current limiting resistor 194 to the power supply 18 discussed previously with reference to FIG. 3. The large capacitor 192 smoothens very high current pulses generated when SCR 184a is triggered.

In this manner, the large pulse through the transformer 174a to the gate of SCR 184a, fires SCR 184a so that the high voltage output from power supply 18 (and across storage capacitor 186a) is fed through a wave shaping resistor 198 and inductor 200 to transformer 22. Resistor 198 functions to dampen the generated pulse. More specifically, by increasing the size of resistor 198 the number of oscillations are decreased. In order to simulate "ringing" of the cable to the avionics device under test, the size of resistor 198 is selected so that only two or three damped oscillations result from each pulse. After the SCR 184a has latched to the "on" position, the current falls below the holding current, thereby causing the SCR 184a to shut off. In order to limit the negative voltage drop between the gate and cathode of the SCR 184a to −1.4 volts, a pair of diodes 202a are connected in series therebetween.

In the present embodiment, SCR's 170a, 184a aid in generating the necessary high voltage pulses. In a preferred embodiment, SCR 170a is a 2N4185 which requires a minimum trigger current of ten milliamperes and which has a maximum breakover voltage of 2.5 volts. When SCR 170a is latched, a sixty volt pulse is generated. This sixty volt pulse, in turn, is used to trigger SCR 184a, which in a preferred embodiment, is a S18CF16A2 which requires a minimum trigger current of fifty milliamperes and which has a maximum breakover voltage of 3.3 volts. When SCR 184a is latched, a six hundred volt pulse is generated which is fed downstream to transformer 22.

In the present invention it was found that a large holding current was necessary to trigger SCR 184a. As shown in FIG. 6B, the cathodes of all the SCRs 184 are tied together at a potential which is above ground. Unless a large trigger current is available to trigger each SCR 184, unstable SCR operation can result. This is accomplished in the present invention by providing the smaller SCR 170a which is turned on by the transistor 166a to deliver sufficient current to turn on the larger SCR 184a.

Figure 8:
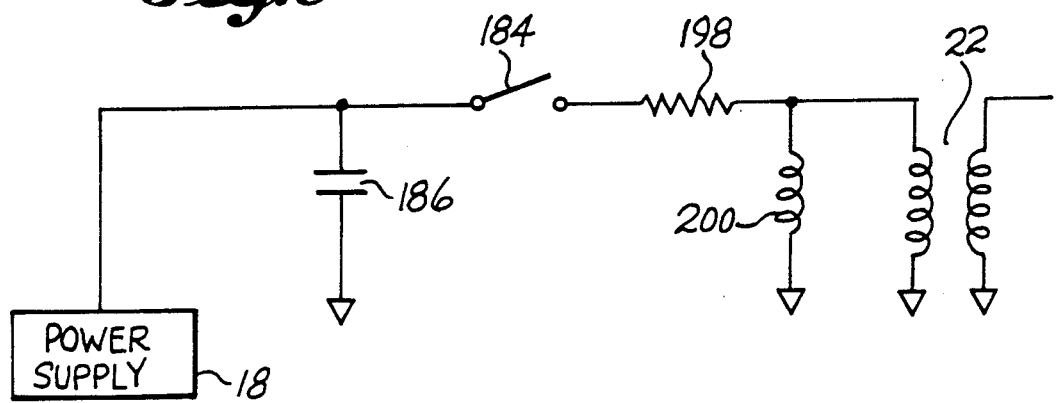
FIG. 8 is a simplified equivalent circuit of the circuit shown in FIG. 6A and 6B.

In order to better understand the present invention, reference is made to an equivalent circuit (FIG. 8) to the aforementioned pulse generating circuit. The equivalent circuit is an LRC circuit which includes the power supply 18, switch (SCR) 184, capacitor 186, resistor 198, inductor 200 and transformer 22. By proper sizing of the resistor 198, capacitor 186 and inductor 200, maximum signal across the load (transformer 22) occurs at a resonance frequency of one mHz. The circuit is sequenced by the SCR switch 184 in response to the sequencing pulses from an upstream sequencing circuit (not shown). In this manner, each one Mhz pulse that is generated, oscillates for three or four times (until damped) to simulate cable ringing.

What is claimed is:

1. Apparatus for generating signals, the apparatus comprising:
   a. trigger signal generating means including
      (1) means for generating a plurality of first trigger signals having random intervals therebetween, and
      (2) means for generating a plurality of second trigger signals having nonrandom intervals therebetween;
   b. means for selecting between the first signal generating means and the second signal generating means, and for providing the trigger signals from the selected means at a first output;
   c. means for generating third signals having signal levels that are greater than levels of the first and second trigger signals; and
   d. means for triggering the third signal generating means, in response to the trigger signals from the first output, so as to output the third signals in a manner that intervals between the third signals are random when the first signal generating means are selected and nonrandom when the second signal generating means are selected.

2. The apparatus as set forth in claim 1 wherein:
   a. the third signal generating means additionally includes
      (1) signal supply means, and
      (2) a plurality of devices for storing signals from the signal supply means; and
   b. the third signal triggering means additionally includes means for triggering the signal storing devices so as to cause the third signals to be output therefrom in a manner that the storing devices are triggered at random intervals when the first signal generating means are selected and at nonrandom intervals when the second signal generating means are selected.

3. The apparatus as set forth in claim 2 wherein:
   a. the third signal generating means additionally includes
      (1) the load means; and
      (2) means for connecting the signal storing devices to
   b. the third signal triggering means includes means for triggering the storing devices so that the storing devices are discharged in a sequential manner through the load means.

4. The apparatus as set forth in claim 3 wherein each of the signal storing devices includes means for storing signals of higher levels than the levels of the trigger signals so as to use the higher level signals to simulate a lightning strike at a device connected to the load.

5. The apparatus as set forth in claim 1 wherein the trigger signal generating means additionally includes:
   a. means for generating groups of signals such that the intervals between the groups are a function of the intervals between the signals from the selected trigger signal generating means;
   b. first means, responsive to the signals from the signal group generating means, for generating trigger signals within each group that have random intervals therebetween, and for providing the trigger signals to the first output;
   c. second means, responsive to the signals from the signal group generating means, for generating trigger signals within each group that have nonrandom intervals therebetween, and for providing the trigger signals tot eh first output; and
   d. means for selecting between the first means and the second means.

6. The apparatus as set forth in claim 5 wherein the trigger signal generating means additionally includes means for selecting between the first means and the second means such that the signals from the selected means are fed to the first output for triggering the third signal generating means so that the third signals are output as (i) a plurality of groups having random intervals between the groups and random intervals between the signals within the group and (ii) a plurality of groups having nonrandom intervals between the groups and nonrandom intervals between the signals within the groups.

7. A method of generating signals for simulating a lightning strike at a device, the method comprising the steps of:
   a. generating a plurality of first signals having random intervals therebetween;
   b. generating a plurality of second signals having nonrandom intervals therebetween;
   c. selecting between the first signals and the second signals and providing the selected signals at a first output;
   d. storing third signals having signal levels that are greater than levels of the first and second signals so as to simulate the signal levels of the lightning strike at the device; and
   e. outputting the third signals to the device, in response to the signals from the first output, such that intervals between the third signals are (i) a function of the intervals between the first signals when the first signals are selected and (ii) a function of the intervals between the second signals when the second signals are selected.

8. The method as set forth in claim 7 additionally comprising the steps of:

a. generating groups of signals such that the intervals between the groups are a function of the intervals between the selected first or second signals;
b. generating trigger signals within each group of signals that have random intervals therebetween;
c. generating trigger signals within each group of signals that have nonrandom intervals therebetween; and
d. selecting between the random interval trigger signals and the nonrandom interval trigger signals and providing the selected trigger signals to the first output.

9. The method as set forth in claim 8 wherein the trigger signal selecting step additionally includes the step of selecting between the random interval trigger signals and the nonrandom interval trigger signals in a manner that the selected signals are provided to the first output for triggering the third signals so that the third signals are output as (i) a plurality of groups having random intervals between the groups and random intervals between the signals within the groups and (ii) a plurality of groups having nonrandom intervals between the groups and nonrandom intervals between the signals within the groups.

* * * * *